(12) United States Patent
Sako et al.

(10) Patent No.: US 7,859,135 B2
(45) Date of Patent: Dec. 28, 2010

(54) INTERNAL POWER SUPPLY CIRCUIT HAVING A CASCODE CURRENT MIRROR CIRCUIT

(75) Inventors: Atsumasa Sako, Kawasaki (JP); Atsushi Takeuchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 370 days.

(21) Appl. No.: 12/147,098

(22) Filed: Jun. 26, 2008

(65) Prior Publication Data

US 2009/0230770 A1    Sep. 17, 2009

(30) Foreign Application Priority Data

Jul. 30, 2007    (JP) .............................. 2007-197524

(51) Int. Cl.
*H01H 47/00* (2006.01)
*H02J 1/10* (2006.01)

(52) U.S. Cl. ......................................... 307/115; 307/43

(58) Field of Classification Search ................. 307/115, 307/43
See application file for complete search history.

(56) References Cited

U.S. PATENT DOCUMENTS 6,052,025 A * 4/2000 Chang et al. ................. 330/253
2007/0057727 A1 * 3/2007 Onishi ......................... 330/258

FOREIGN PATENT DOCUMENTS

| JP | 9-062380 A | 3/1997 |
| JP | 2001-028188 A | 1/2001 |
| JP | 2004-259275 A | 9/2004 |

* cited by examiner

*Primary Examiner*—Jared J Fureman
*Assistant Examiner*—Dru M Parries
(74) *Attorney, Agent, or Firm*—Arent Fox, LLP

(57) ABSTRACT

A current mirror circuit which is connected to first and second power supplies and generates a desired current, has a plurality of first transistors which are connected in parallel to the first power supply side and the gates of which are connected to a common node, a plurality of second transistors which are cascode-connected to the plurality of first transistors and the gates of which are supplied with a cascode bias potential and a cascode bias generation circuit which generates the cascode bias potential, wherein the cascode bias generation circuit maintains the cascode bias potential during normal operation at a first potential between the potentials of the first and second power supplies, and maintains the cascode bias potential during power-on at a second potential closer to the potential of the second power supply than the first potential.

11 Claims, 17 Drawing Sheets

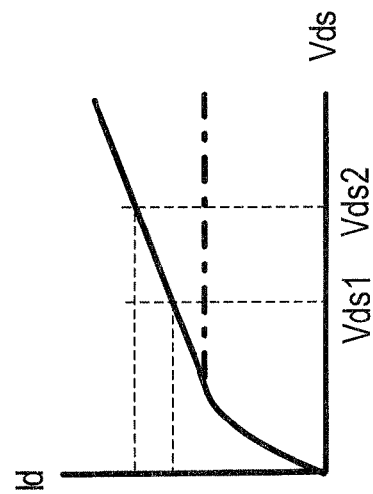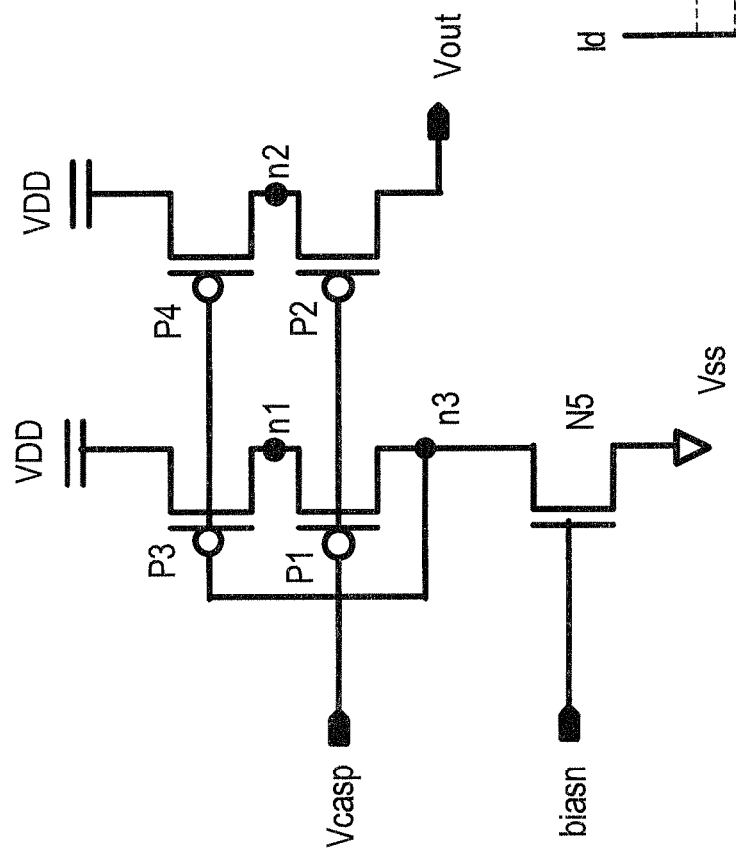
FIG.3

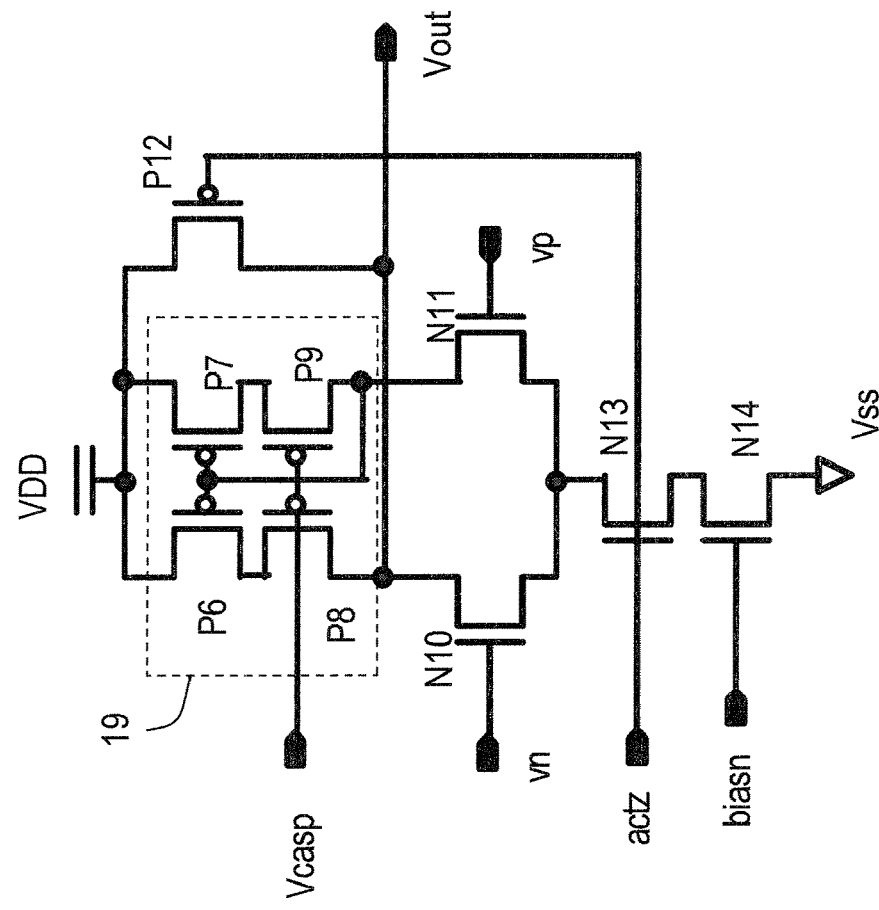
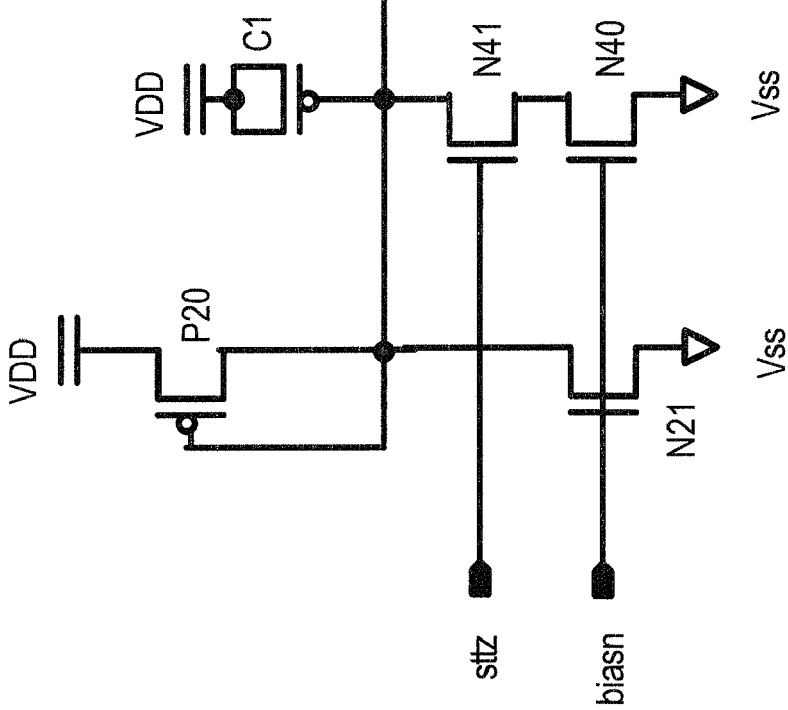
FIG.12

INTERNAL POWER SUPPLY CIRCUIT HAVING A CASCODE CURRENT MIRROR CIRCUIT

CROSS-REFERENCE TO RELATED APPLICATIONS

This application is based upon and claims the benefit of priority from the prior Japanese Patent Application No. 2007-197524, filed on Jul. 30, 2007, the entire contents of which are incorporated herein by reference.

BACKGROUND OF THE INVENTION

1. Field of the Invention

This invention relates to an internal power supply circuit of a semiconductor integrated circuit, and in particular relates to an internal power supply circuit having a cascode current mirror circuit, and to a startup circuit for cascode bias.

2. Description of the Related Art

In order to attain both fast operation and low power consumption, semiconductor integrated circuits such as DRAMs have internal power supply circuits which generate an internal step-down power supply from an external power supply. Internal circuitry operates by means of the internal step-down power supply. In the case of DRAM, the internal power supply circuit generates an internal step-down power supply VII lower than the external power supply VDD. The internal power supply circuit also generates an internal step-up power supply VPP higher than the external power supply VDD.

The internal step-down power supply VII is supplied to the DRAM peripheral circuits, and is also supplied to the memory core having a memory cell array. Also, the internal step-up power supply VPP and a separate internal step-down power supply lower than the internal step-down power supply VII are supplied to the memory core. The internal step-down power supply VII and internal step-up power supply VPP are generated from the external power supply VDD.

For the above and other reasons, during power supply startup the internal power supply circuit monitors the rise of the external power supply VDD, and after detecting the rise, starts up the internal step-down power supply generation circuit and internal step-up power supply generation circuit. In addition, the rise of the internal step-down power supply VII is monitored, and after detecting the rise, the separate internal step-down power supply generation circuit is started. Upon detecting the rise of all internal power supplies, the internal power supply circuit outputs a start signal indicating that the series of internal power supply startup operations has ended. In response to this start signal, the internal circuit begins operation. In order to control the power supply startup operation sequence, the internal power supply circuit has a sequencer.

Internal step-down power supply generation circuits are disclosed in the following patent references. In Japanese Patent Laid-open No. 2001-28188, a circuit which generates two internal step-down power supplies is disclosed; in Japanese Patent Laid-open No. 09-62380, an internal step-down power supply circuit is disclosed.

The internal power supply circuit has for example a current mirror circuit in a differential amplifier or similar to detect the internal power supply potential. A current mirror circuit generates a current proportional to the size of each transistor by applying a common potential to the gate of a transistor provided in parallel on the power supply side. By adopting a current mirror circuit as the load circuit for the differential amplifier, equal currents can be supplied to a pair of differential transistors, so that offsets and mismatches are prevented.

Transistors which have become increasingly smaller in size in recent years have characteristics in which, in the saturation region, the drain current depends on the drain-source voltage. A cascode structure has been proposed for current mirror circuits to accommodate this fact. By employing a cascode structure, the drain potentials of the current source transistors provided in parallel with the current mirror circuit can be made equal, and the drain-source voltages can be kept equal, so that current mirror circuits can be made to operate normally.

However, there is the problem that, when an external power supply rises when turning on power, the cascode bias potential supplied to a cascode-connected transistor is temporarily higher or lower than the ordinary potential. In the normal operating state, it is required that a constant potential difference be maintained between the cascode bias voltage and the power supply serving as reference; but at power-on, the potential changes to a potential different from the potential in the normal operating state, impeding normal operation of the cascode current mirror circuit. As a result, anomalies occur in the circuit operation of differential amplifiers and other circuits having a cascode current mirror circuit. For example, anomalies occur in circuits generating an internal step-down power supply VII and in circuits generating an internal step-up power supply VPP, so that there is overshooting of the internal step-down power supply VII or internal step-up power supply VPP, greatly detracting from the reliability of devices connected thereto.

SUMMARY OF THE INVENTION

Hence an object of this invention is to provide a cascode current mirror circuit which prevents erroneous operation at the time power is turned on.

A further object of this invention is to provide an internal power supply circuit having a cascode current mirror circuit which prevents erroneous operation at the time power is turned on.

In order to attain the above objects, in a first aspect of the invention, a current mirror circuit which is connected to first and second power supplies and generates a desired current, has:

a plurality of first transistors which are connected in parallel to the first power supply side and the gates of which are connected to a common node;

a plurality of second transistors which are cascode-connected to the plurality of first transistors and the gates of which are supplied with a cascode bias potential; and a cascode bias generation circuit which generates the cascode bias potential, wherein the cascode bias generation circuit maintains the cascode bias potential during normal operation at a first potential between the potentials of the first and second power supplies, and maintains the cascode bias potential during power-on at a second potential closer to the potential of the second power supply than the first potential.

In a more preferred mode of the first aspect, the second power supply voltage is lower than the first power supply voltage, the first and second transistors are P-channel MOS transistors, and the second potential is lower than the first potential.

In a more preferred mode of the first aspect, the second power supply voltage is higher than the first power supply voltage, the first and second transistors are N-channel MOS transistors, and the second potential is higher than the first potential.

In order to attain the above objects, in a second aspect of the invention, an internal power supply generation circuit which generates an internal power supply from a first or a second power supply, has:

a differential amplifier circuit, having as a load circuit the current mirror circuit described in the first aspect; and an output circuit, which generates the internal power supply according to an output signal of the differential amplifier circuit, wherein the differential amplifier circuit generates the output signal according to a potential difference between a potential of the internal power supply generated by the output circuit and a desired reference potential.

In a more preferred mode of the second aspect, the internal power supply potential is maintained at a potential between the potentials of the first and second power supplies, and the output circuit has an output transistor which is conducting according to the output signal of the differential amplifying circuit and supplies a power supply current from the first or second power supply to the internal power supply.

In a more preferred mode of the second aspect, the internal power supply potential is maintained at a potential outside the potentials of the first and second power supplies, and the output circuit has an oscillation circuit which operates according to an output signal of the differential amplifying circuit and a pump circuit which supplies, with pumping, a power supply current from the first or second power supply to the internal power supply by means of oscillation pulses of the oscillation circuit.

By means of this invention, erroneous operation of a cascode current mirror circuit at the time power is turned on can be prevented.

BRIEF DESCRIPTION OF THE DRAWINGS

FIG. 3 is a circuit diagram of a cascode current mirror circuit;

FIG. 12 is a circuit diagram of the cascode bias generation circuit 13 in a first embodiment;

DESCRIPTION OF THE PREFERRED EMBODIMENTS

Figure 1:
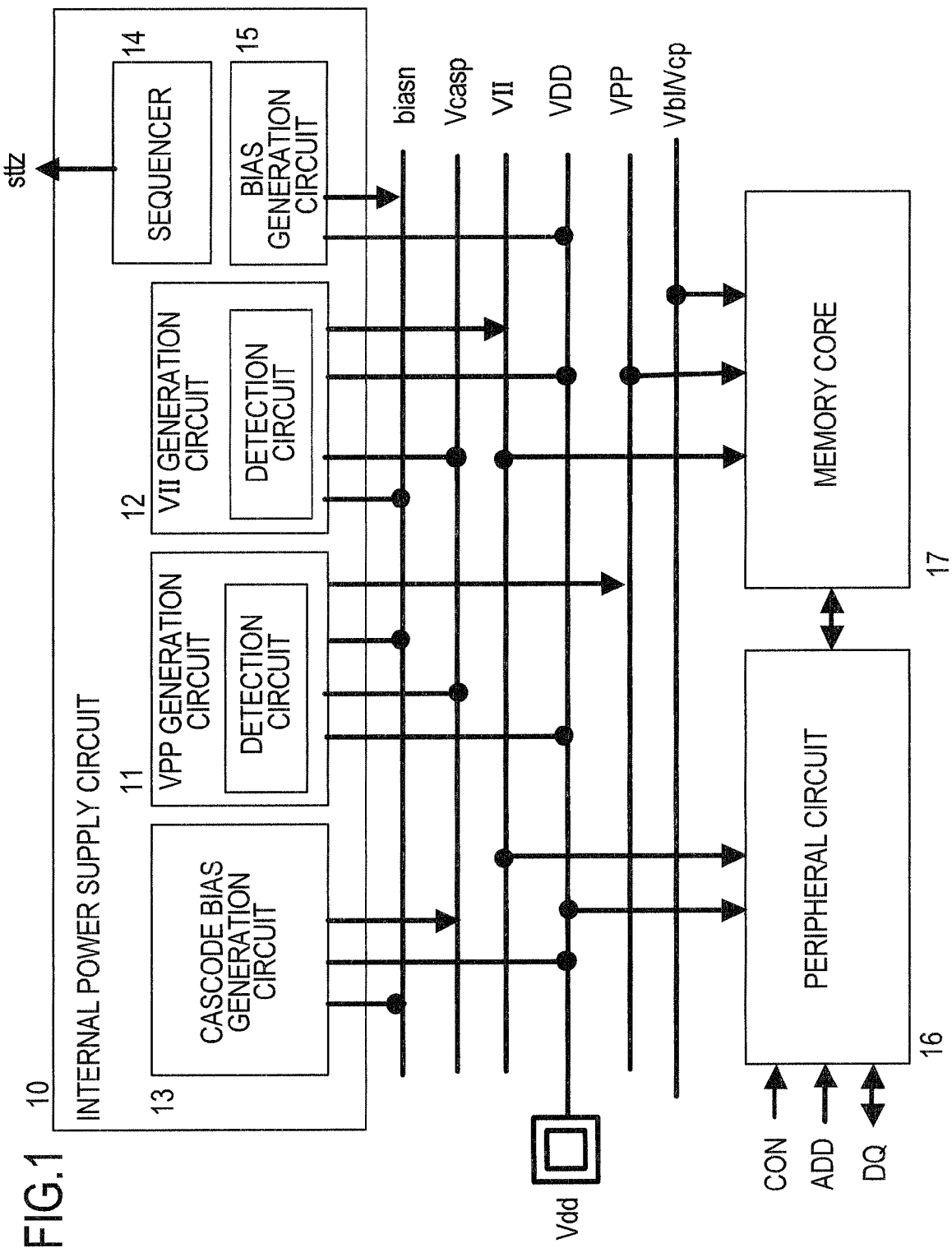
FIG. 1 shows the configuration of DRAM, which is a semiconductor integrated circuit.

Below, embodiments of the invention are explained referring to the drawings. However, the technical scope of the invention is not limited to these embodiments, but extends to the inventions described in the Scope of Claims and to inventions equivalent thereto.

FIG. 1 shows the configuration of DRAM, which is one type of semiconductor integrated circuit. The DRAM has an internal power supply circuit 10, which generates an internal power supply from an externally supplied power supply VDD; a peripheral circuit 16, to which is supplied the internal step-down power supply voltage VII and external power supply voltage VDD; and a memory core 17, to which the internal step-down power supplies VII, Vbl, Vcp and the internal step-up power supply voltage VPP is supplied. The peripheral circuit 16 takes as input a control signal CON and address ADD from a memory controller, not shown, and inputs or outputs input/output data DQ. Within the memory core 17 are provided a word decoder, column decoder, a memory cell array, sense amp, and similar.

The internal power supply circuit 10 has a step-up power supply generation circuit 11, which steps up the external power supply voltage VDD to generate a step-up power supply voltage VPP; an internal step-down power supply generation circuit (VII generation circuit) 12, which generates an internal power supply voltage VII from the external power supply voltage VDD; and an internal step-down power supply generation circuit (not shown) which generates internal step-down power supply voltages Vbl, Vcp from the internal step-down power supply voltage VII. Further, the VPP generation circuit 11 and VII generation circuit 12 each incorporate a detection circuit which detects the respectively generated power supply voltages VPP, VII. Also, the internal power supply circuit 10 has a sequencer 14 which controls the internal power supply startup sequence. The sequencer 14 sets the start signal Sttz to H level during power supply startup, and to L level at the end of power supply startup. Moreover, a cascode bias generation circuit 13, which generates a cascode bias potential to be supplied to the cascode current mirror circuit, and a bias generation circuit 15 to generate a bias potential, are also provided.

The internal step-down power supply voltage VII is at a lower potential than the external power supply voltage VDD, and the internal step-down power supply voltages Vbl, Vcp are at lower potentials than the internal step-down power supply voltage VII. Further, the internal step-up power supply voltage VPP is at a higher potential than the external power supply voltage VDD. By operating the internal circuitry using the internal step-down power supplies, low power consumption and high-speed operation are possible.

Figure 2:
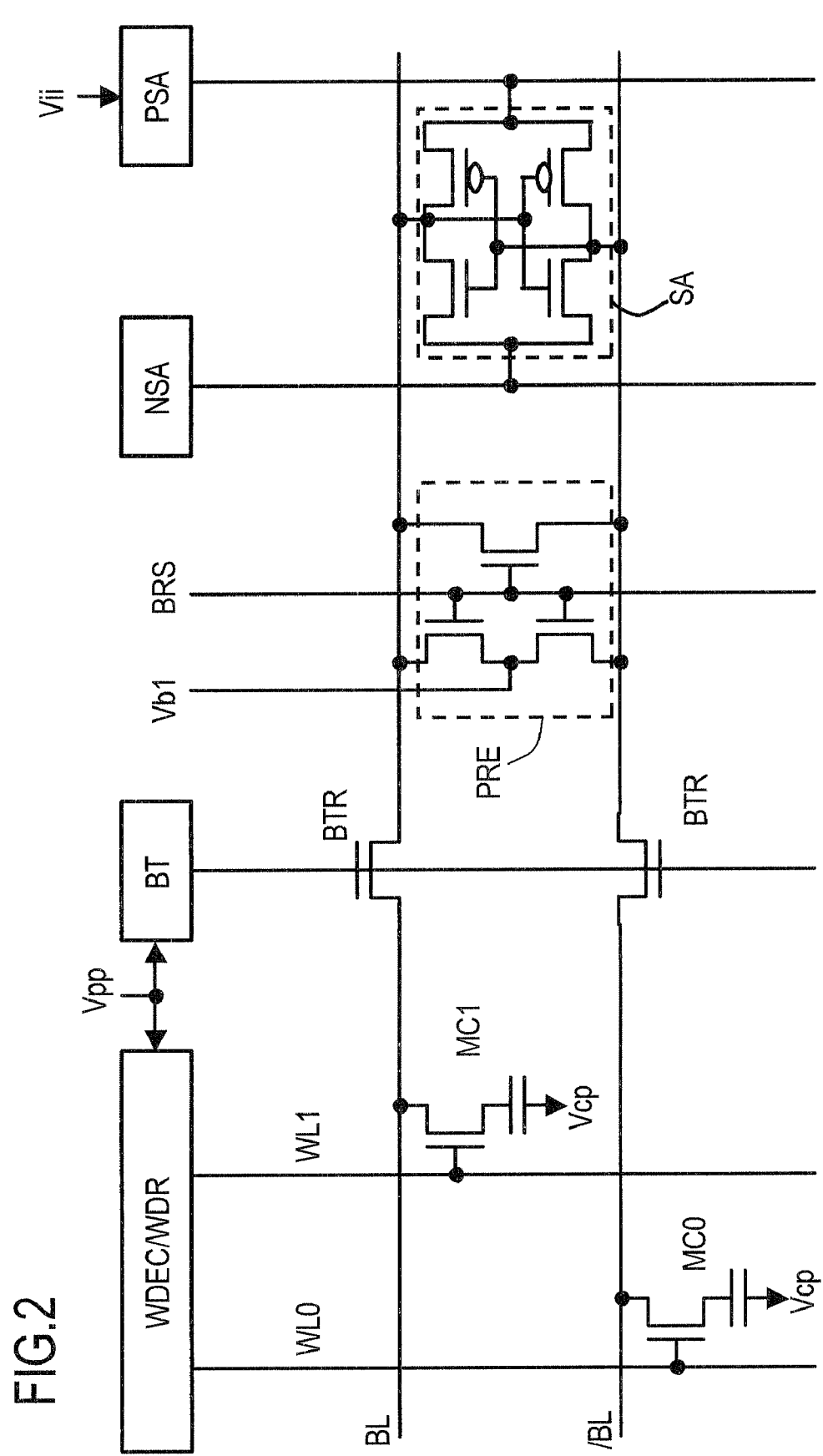
FIG. 2 shows the configuration of the memory core 17 within DRAM.

FIG. 2 shows the configuration of the memory core 17 in DRAM. Within the memory core 17 are provided a memory cell array, having a plurality of word lines WL0, WL1, a plurality of bit lines BL, /BL, and a plurality of memory cells MC0, MC1 provided at the positions of intersection thereof; a word decoder/driver WDEC/WDR; a bit line precharge circuit PRE; and a sense amp SA. The bit lines BL, /BL are connected to the bit line precharge circuit PRE and sense amp SA via the bit line transfer transistors BTR, /BTR. The gates of the bit line transfer transistors BTR, /BTR are controlled by the bit line transfer driving circuit BT. The sense amp SA is driven by the N-channel side driving circuit NSA and P-channel side driving circuit PSA.

The step-up power supply voltage VPP generated by the internal power supply circuit 10 is supplied to the word decoder/word driver WDEC/WDR, and the word lines WL are driven to the step-up power supply voltage level. The bit line transfer driving circuit BT is also driven by the step-up power supply voltage VPP. The internal step-down power supply voltage VII is supplied to the P-channel side driving circuit PSA, and the sense amp SA is driven by the internal step-down power supply voltage VII and ground power supply voltage Vss.

On the other hand, the internal step-down power supply voltage Vbl is connected to the bit line precharge circuit PRE, and used as the precharge level for the bit line pair BL, /BL. The internal step-down power supply voltage Vcp is connected to the opposing electrodes of the capacitors of the memory cells MC0, MC1. That is, the internal step-down power supply Vbl is the bit line precharge power supply, and the internal step-down power supply Vcp is the cell plate power supply.

Memory operation is as follows. First, with the bit line pair BL, /BL precharged to the level of the second internal step-down power supply voltage Vbl, one of the word lines WL0, WL1 is driven to the level of the internal step-up power supply voltage VPP, and the information in the memory cell is read to the bit line pair. In this state, the sense amp SA is activated, one bit line of the bit line pair is pulled up to the first internal step-down power supply voltage VII, and the other is pulled down to the ground power supply voltage Vss.

FIG. 3 is a circuit diagram of a cascode current mirror circuit. FIG. 3 shows a cascode current mirror circuit formed from P-channel transistors P1, P2, P3, P4. The transistors P3, P4 are a pair of first transistors connected in parallel on the side of power supply VDD, with gates connected to the common node n3. The first transistors P3, P4 are cascode-connected to the pair of second transistors P1, P2. That is, transistors P2, P4 are a cascode-connected current source circuit, and transistors P1, P3 are a cascode-connected bias generation circuit for the former. A P-channel cascode bias potential Vcasp is supplied to the gates of the second transistors P1, P2. Also, an N-channel transistor N5 is provided between node n3 and ground Vss, with a bias potential biasn supplied to the gate.

When the bias potential biasn reaches a prescribed potential, the transistor N5 conducts, the potential at node n3 is pulled down, and transistors P3, P4 conduct. If the circuit is designed such that the source-drain voltage Vds of transistors P3, P4 is sufficiently high and the transistors P3, P4 operate in the saturation region, then application of the potential at common node n3 to the gates causes the source-gate voltages of the transistors P3, P4 to be equal, and currents proportional to the transistor sizes can be made to flow in the transistors P3, P4.

On the lower-right in FIG. 3 is shown a characteristic indicating the relation between the transistor source-drain voltage Vds and the drain current Id. In a normal transistor, as indicated by the dot-dash line, in the saturation region the drain current Id is constant regardless of the source-drain voltage Vds. This is the basic principle of a cascode current mirror circuit. However, when, due to reduction of the sizes of transistors and other factors, the actual characteristic assumes the slope indicated by the solid line, a difference between the source-drain voltages Vds1, Vds2 causes the drain currents to be different.

Hence the second transistors P1, P2 are cascode-connected, and the cascode bias potential Vcasp is set such that Vcasp≦VDD−Vthp−Vov (where Vthp is the P-channel transistor threshold voltage, and Vov is the source-drain overdrive voltage at which operation is possible in the saturation region for transistors P3, P4). By providing second transistors P1, P2 the potentials at nodes n1, n2, which are the drains of the first transistors P3, P4, are controlled so as to be higher than the cascode bias potential Vcasp by the threshold voltage Vthp. That is, when the nodes n1, n2 are higher than the potential Vcasp+Vthp, the transistors P1, P2 conduct more readily, lowering the potentials at nodes n1, n2, and when the nodes n1, n2 are lower than the potential Vcasp+Vthp, the transistors P1, P2 cease to conduct, interfering with the lowering of the potentials at nodes n1, n2. That is, nodes n1, n2 are fixed at the potential Vcasp+Vthp. As a result, the source-drain voltages Vds of transistors P3, P4 are equal, and equal to the overdrive voltage Vov.

Thus by means of cascode connections, transistors P3, p4 operate with equal source-drain voltages Vds in the saturation region, and the drain currents Id are equal for transistors of equal size, and different in proportion to different sizes. In this way, through cascode connections, a current mirror circuit operates normally even when the transistor characteristic is as indicated by the solid line in the bottom-right of the figure. In the circuit of FIG. 3, when the bias potential biasn is at H level the transistor N5 is conducting, and a fixed current is generated at the output Vout corresponding to the ratio of the sizes of transistors P3, P4.

Figure 4:
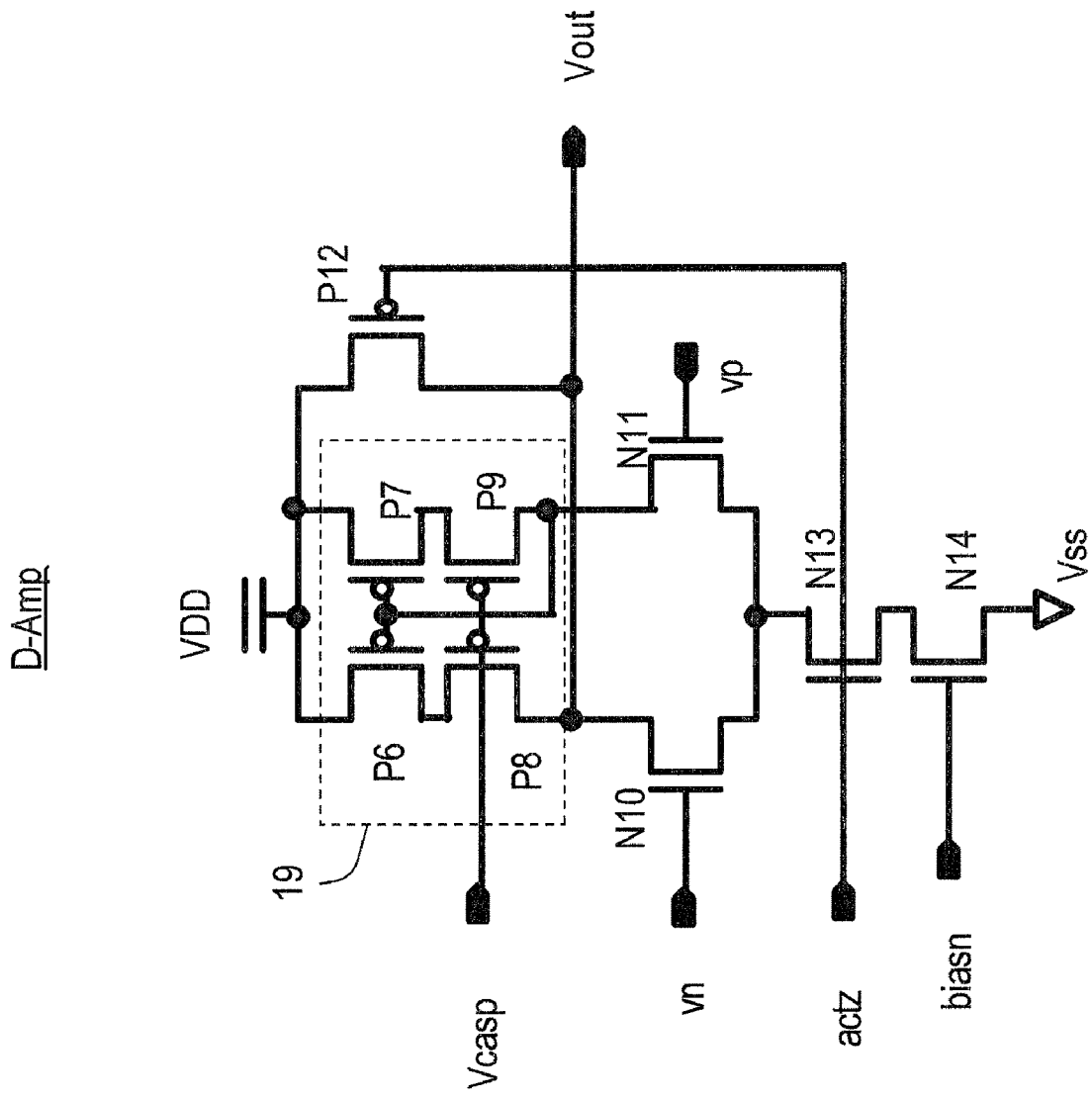
FIG. 4 is a circuit diagram of a differential amplifier circuit having a cascode current mirror circuit.

FIG. 4 is a circuit diagram of a differential amplifier circuit having a cascode current mirror circuit. The differential amplifier circuit D-Amp comprises a pair of N-channel input transistors N10, N11, to the gates of which input voltages vn, vp are supplied; an N-channel transistor N14, which is a current switch; transistors P12, N13, which are made conducting/non-conducting by an activation signal actz; and a cascode current mirror circuit 19, surrounded by a dashed line. The cascode current mirror circuit 19 has P-channel first transistors P6, P7, connected in parallel on the side of the power supply VDD, and P-channel second transistors P8, P9, cascode-connected to these; the gates of transistors P6, P7 are connected in common to the drain terminal of input transistor N11, and the P-channel cascode bias potential Vcasp is supplied to the transistors P8, P9.

By making the transistor sizes in the current mirror circuit equal, equal currents can be made to flow in transistors P6, P7. Further, by using cascode connections, through the principle described above, the source-drain voltages Vds of transistors P6, P7 can be made equal.

The output Vout of the differential amplifier circuit goes to H level or L level according to the potential difference of the input voltages vn, vp. For example, when vn>vp, transistor N10 conducts more readily, transistor N11 conducts less readily, and the output Vout goes to L level. Conversely, when vn<vp, transistor N10 conducts less readily, N11 conducts more readily, and the output Vout goes to H level.

By using the cascode current mirror circuit 19, the effect of saturation characteristics can be reduced, and the load currents of the differential amplifier circuit can be made equal. Moreover, the drain currents Id of transistors P6, P7 can be held constant for slight changes in the output Vout, so that the effective output impedance can be increased.

Figure 5:
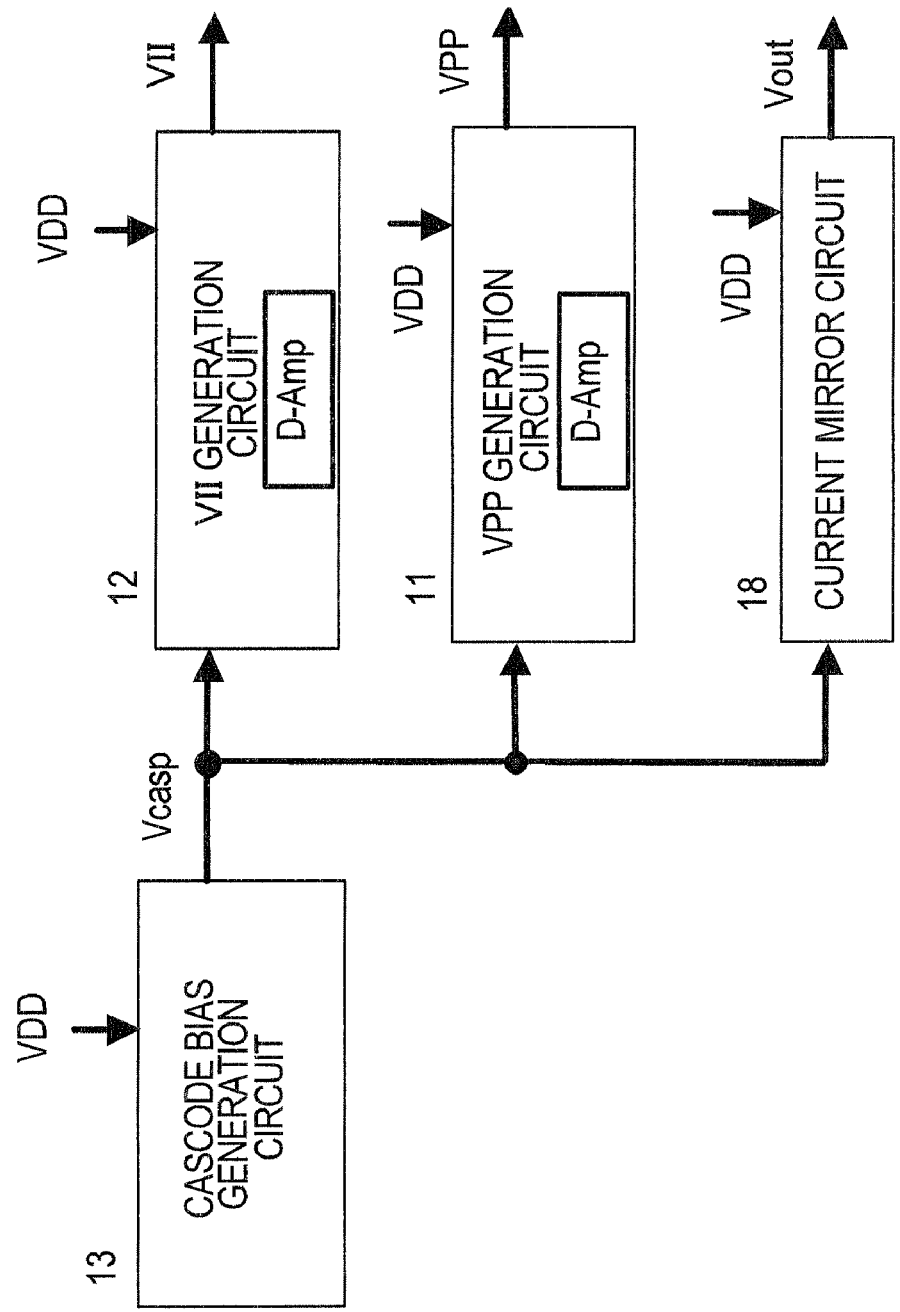
FIG. 5 shows an example of a configuration using a cascode current mirror circuit.

FIG. 5 shows an example of a configuration used in a cascode current mirror circuit. The cascode bias generation circuit 13 generates a cascode bias potential Vcasp, which is supplied to the VII generation circuit 12, VPP generation circuit 11, and current mirror circuit 18. The VII generation circuit 12 generates the internal step-down power supply voltage VII from the external power supply voltage VDD, but in order to hold the level at a desired reference potential, a detection circuit comprising a differential amplifier circuit D-Amp is incorporated. The VPP generation circuit 11 generates the internal step-up power supply voltage VPP from the external power supply voltage VDD, but in order to hold the level at a desired reference potential, a detection circuit comprising a differential amplifier circuit D-Amp is incorporated. These differential amplifier circuits D-Amp use a cascode-connected current mirror circuit as shown in FIG. 4, therefore a cascode bias potential Vcasp is supplied. Below, the circuit configurations of the cascode bias generation circuit 13, VII generation circuit 12, and VPP generation circuit 11 are explained.

Figure 6:
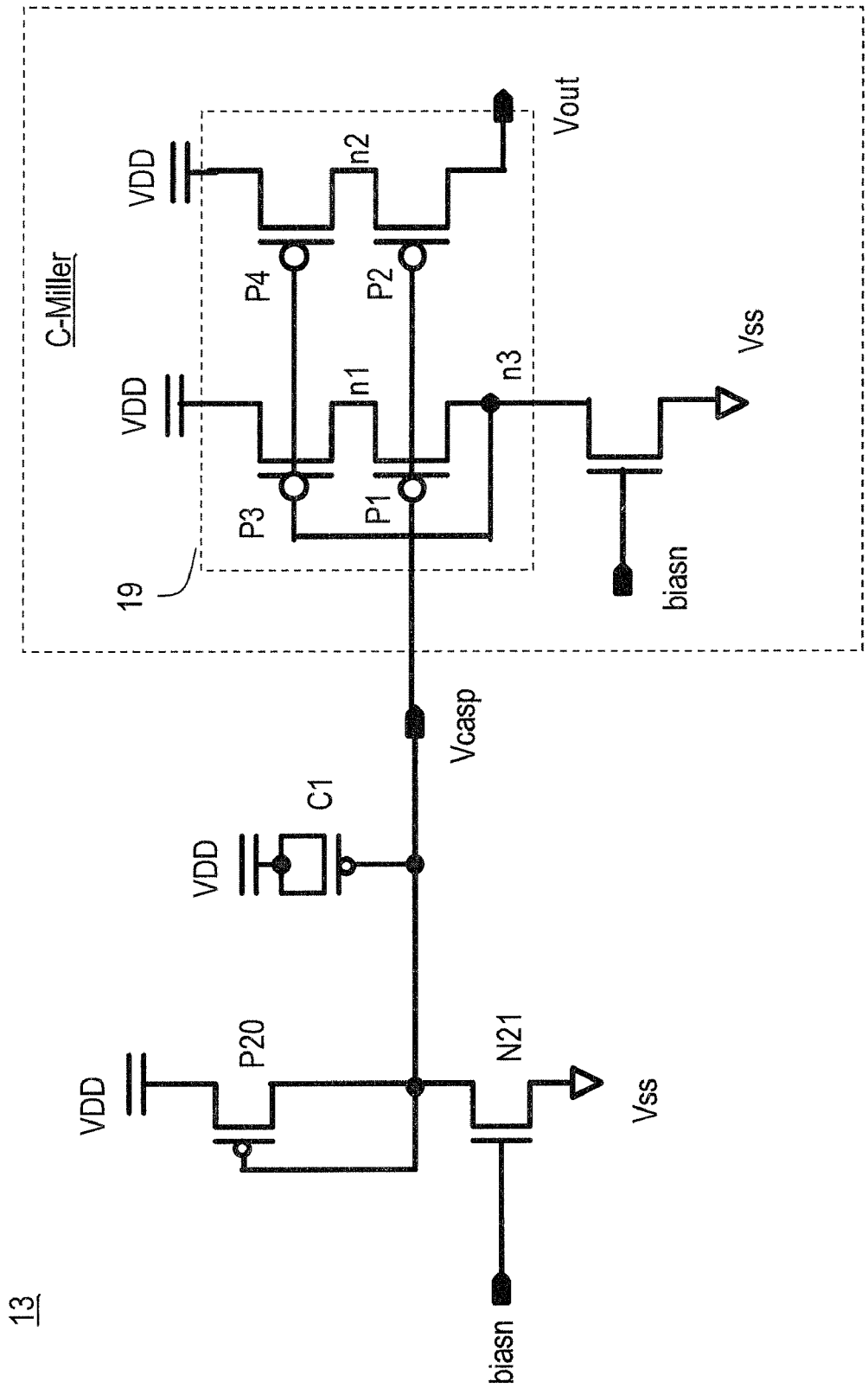
FIG. 6 is a circuit diagram of a cascode bias generation circuit 13.

FIG. 6 is a circuit diagram of the cascode bias generation circuit 13. In FIG. 6, the cascode bias circuit 13 and a current mirror circuit C-Mirror (see FIG. 3), to which the cascode bias potential Vcasp is supplied, are shown. In place of the current mirror circuit C-Mirror, the differential amplifier D-Amp of FIG. 4 may be used. The cascode bias potential Vcasp is supplied to the gates of the P-channel transistors P1, P2 of the cascode current mirror circuit 19, so that this cascode bias potential Vcasp is a P-channel bias potential.

The cascode bias generation circuit 13 has a P-channel transistor P20, N-channel transistor N21, and coupling capacitor C1. The bias voltage biasn is applied to the gate of transistor N21 and current is passed, to generate the cascode bias potential Vcasp. By making the value of W/L (where W is the gate width and L the gate length) of transistor P20 smaller than that of the transistors of the current mirror circuit, the conducting resistance of transistor P20 can be made high, to realize the above-described condition Vcasp≦VDD−Vthp−Vov. Further, a coupling capacitor C1 is provided between power supply VDD and cascode bias potential Vcasp, and when power supply VDD fluctuates with high frequency in the normal operating state the cascode bias potential Vcasp follows these fluctuations, so that Vcasp≦VDD−Vthp−Vov can be maintained.

Figure 7:
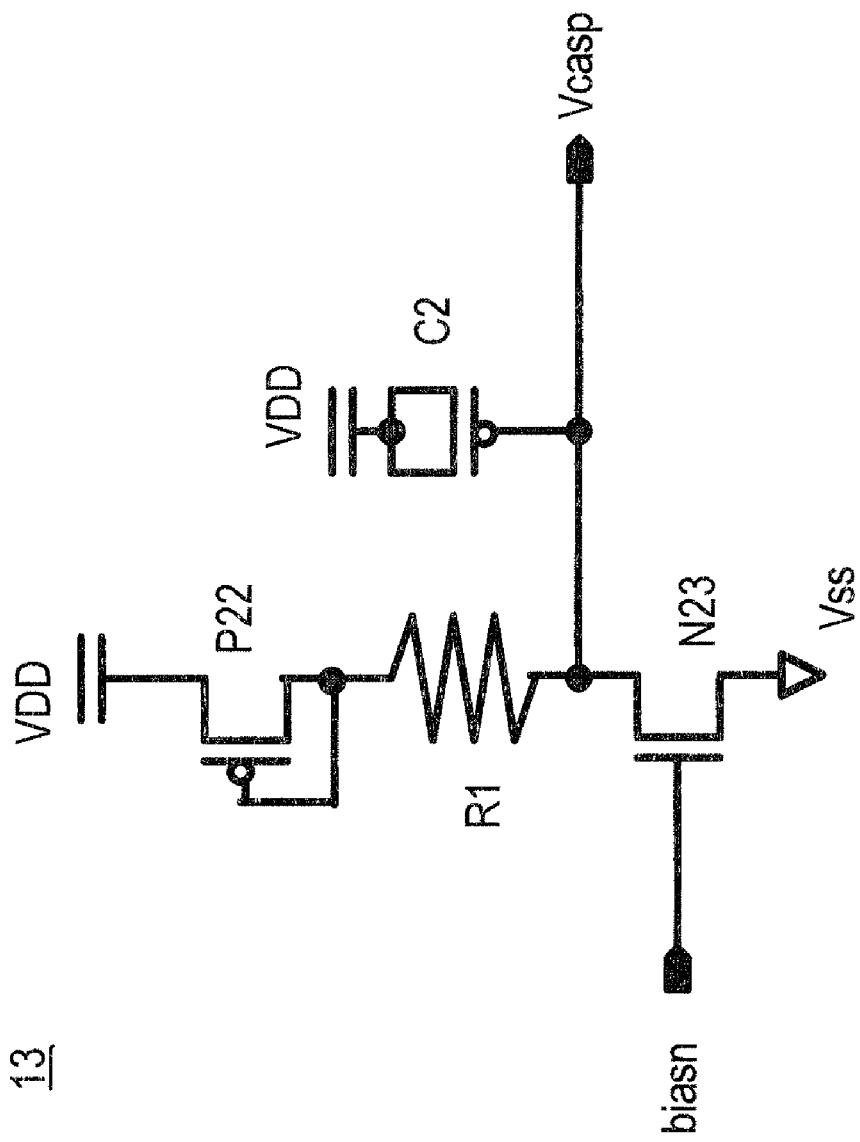
FIG. 7 is a circuit diagram of another cascode bias generation circuit 13.

FIG. 7 is a circuit diagram of another cascode bias generation circuit 13. This cascode bias generation circuit comprises a P-channel transistor P22, resistance R1, N-channel transistor N23, and coupling capacitor C2. The transistor P22 need not have a small W/L as in the case of the transistor P20 of FIG. 6, and by dropping the voltage using the resistance R1, Vcasp≦VDD−Vthp−Vov is attained. Otherwise the circuit is the same as in FIG. 6.

Figure 8:
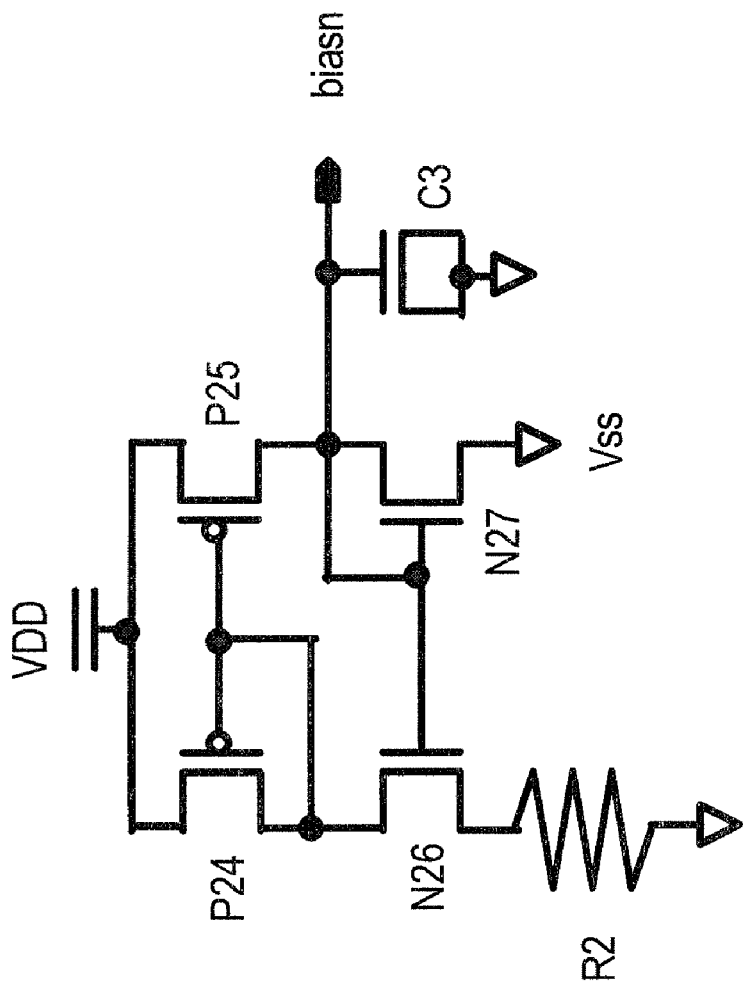
FIG. 8 is a circuit diagram of a bias generation circuit 15.

FIG. 8 is a circuit diagram of a bias generation circuit 15. This bias generation circuit comprises transistors P24, P25 forming a P-channel current mirror circuit, N-channel transistors N26, N27, a resistance R2, and a coupling capacitor C3. The bias generation circuit 15 maintains the bias potential biasn at a constant potential higher than ground Vss by the voltage drop across resistance R2 and the threshold voltage of transistor N26. In order to maintain the constant potential above ground Vss, a coupling capacitor C3 is provided.

Figure 9:
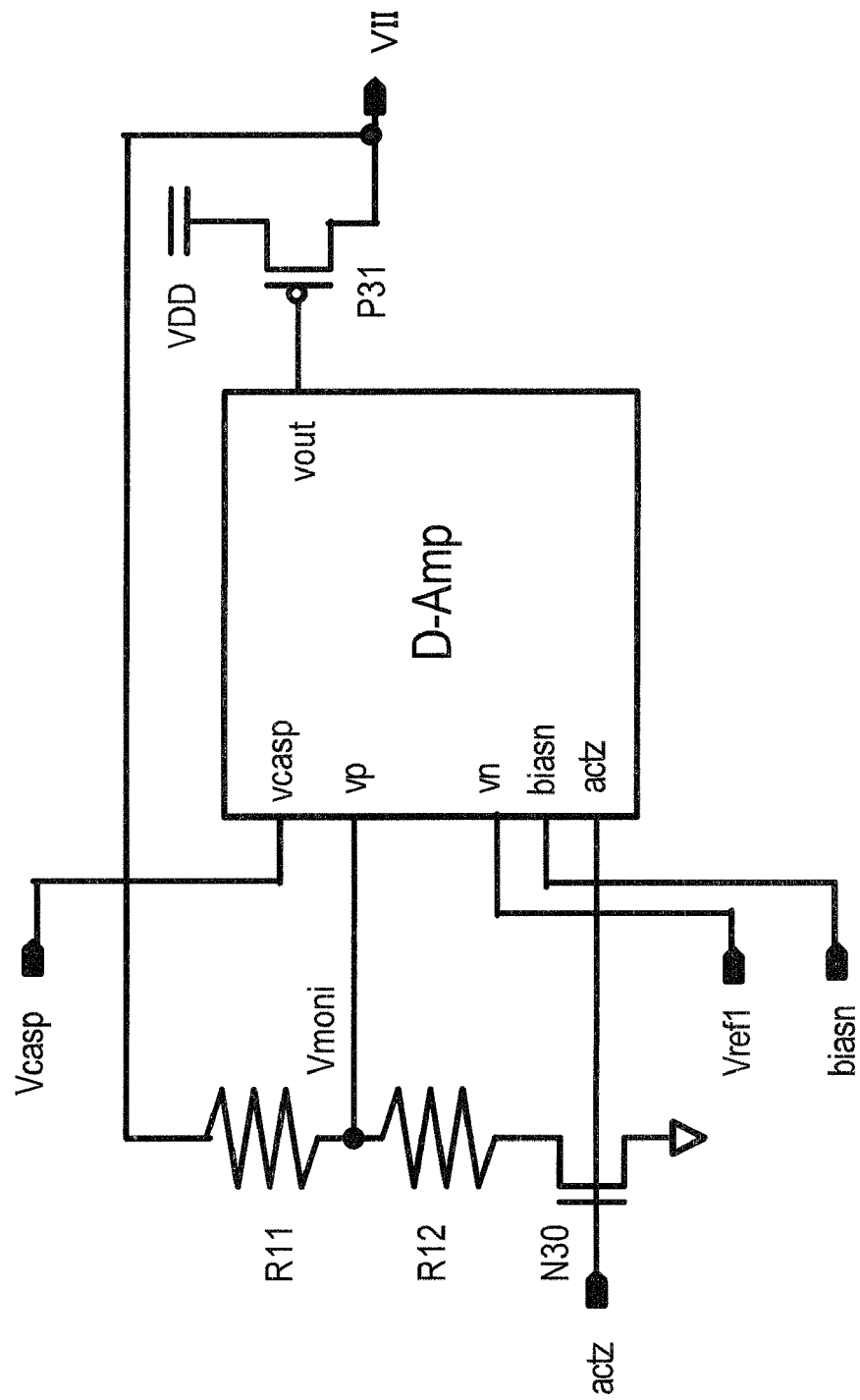
FIG. 9 is a circuit diagram of an internal step-down power supply generation circuit.

FIG. 9 is a circuit diagram of an internal step-down power supply generation circuit. The internal step-down power supply generation circuit 12 has a P-channel transistor P31 forming an output circuit, and a differential amplifier circuit D-Amp which generates an output signal Vout according to the potential difference between the potential of the internal step-down power supply voltage VII and a desired reference potential. The differential amplifier circuit D-Amp is the same as in FIG. 4. A feedback loop is formed by resistances R11, R12 and the N-channel transistor N30, and the potential at the connection point between the resistances R11, R12 is supplied to one input vp of the differential amplifier circuit D-Amp as the monitored potential Vmoni. The reference potential Vrefl is input to the other input vn. Hence a detection circuit is formed by the differential amplifier circuit D-Amp and the feedback loop. The cascode bias potential Vcasp, bias potential biasn, and activation signal actz are as explained in FIG. 4.

The differential amplifier circuit D-Amp generates an output signal Vout according to the potential difference between the two input potentials vp, vn, and operates so as to make Vrefl=Vmoni due to the feedback loop. That is, if the monitored potential Vmoni is lower than the reference potential Vrefl, the output signal Vout is at L level, the output transistor P31 is conducting, and the internal step-down power supply voltage VII rises. Conversely, if the monitored potential Vmoni is higher than the reference potential Vrefl, the output signal Vout goes to H level, the output transistor P31 is non-conducting, and the internal step-down power supply voltage VII falls. Hence the internal step-down power supply voltage VII is maintained at VII=Vrefl*(R1+R2)/R2.

The internal step-down power supply generation circuit 12 may also be provided with an N-channel transistor as an output transistor which takes the output of the drain terminal of P-channel transistor P31 as the gate input. In this case, the N-channel output transistor drives the internal step-down power supply VII according to the drain terminal voltage of transistor P31, held at a constant potential by the feedback loop and differential amplifier circuit D-Amp.

Figure 10:
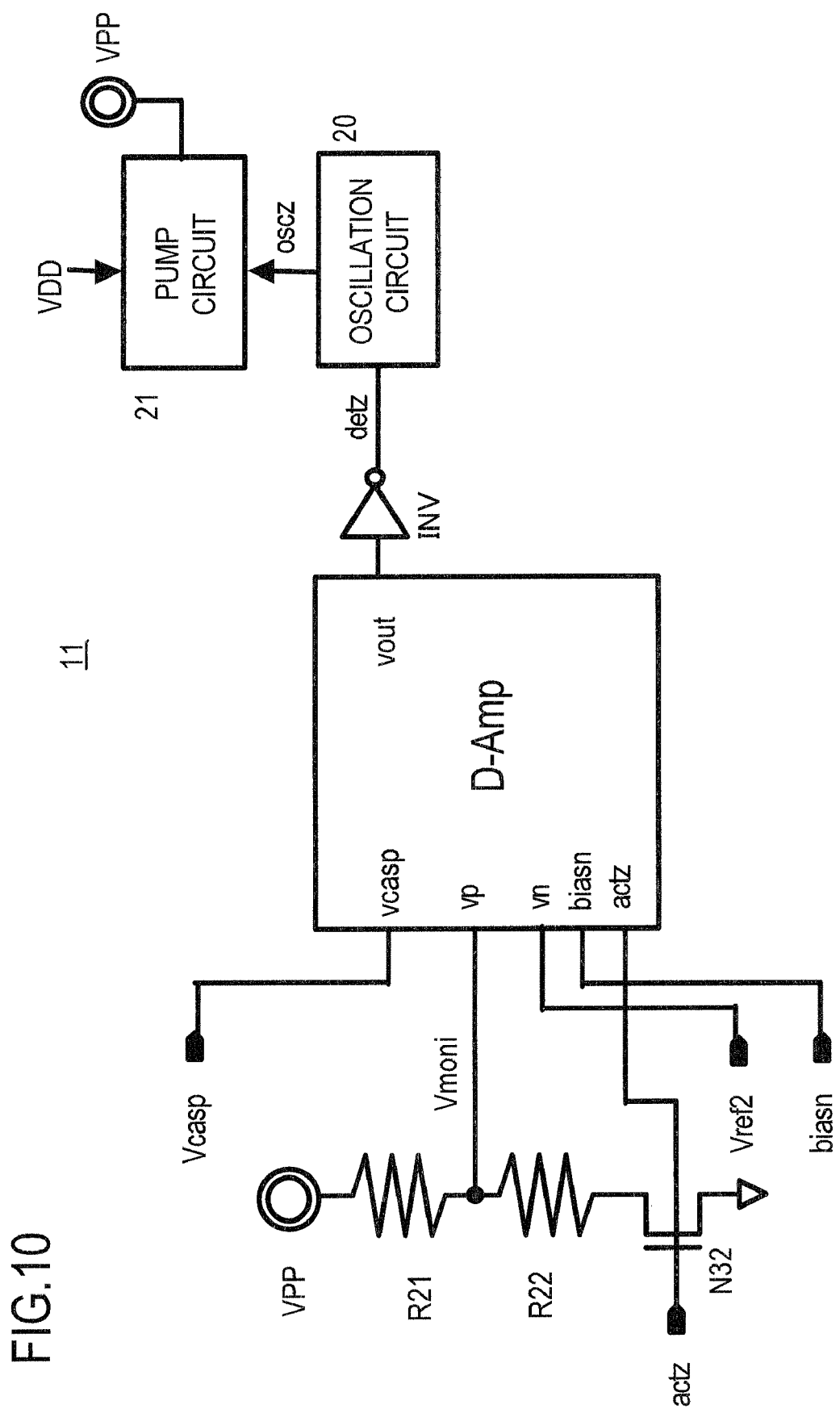
FIG. 10 is a circuit diagram of an internal step-up power supply generation circuit.

FIG. 10 is a circuit diagram of an internal step-up power supply generation circuit. The internal step-up power supply generation circuit 11 has a detection circuit, formed by resistances R21, R22 and a transistor N32 in a feedback loop, a differential amplifier circuit D-Amp, and an inverter INV; an oscillation circuit 20, which operates according to the detection signal detz of the detection circuit; and a pump circuit 21 which performs step-up operation (pumping operation) using the oscillation pulse oscz generated by the oscillation circuit 20. The pump circuit 21 outputs charge from the power supply VDD through pumping action using the oscillation pulse oscz, to maintain the internal step-up power supply voltage VPP at the desired level.

In this case also, the differential amplifier circuit D-Amp operates so as to generate an output signal Vout according to the potential difference between the two input potentials vp, vn, and by means of the feedback loop Vref2=Vmoni. That is, when the monitored potential Vmoni is lower than the reference potential Vref2, the output signal Vout goes to L level and the detection signal detz goes to H level, the oscillation circuit 20 outputs oscillation pulses oscz, and the pump circuit 21 steps up the internal step-up power supply voltage VPP. Conversely, when the monitored potential Vmoni is higher than the reference potential Vrefl, the output signal Vout goes to H level and the detection signal detz goes to L level, the oscillation circuit 20 stops, and the internal step-up power supply voltage VPP falls. Hence the internal step-up power supply voltage VPP is maintained at VPP=Vrefl*(R1+R2)/R2.

Figure 11:
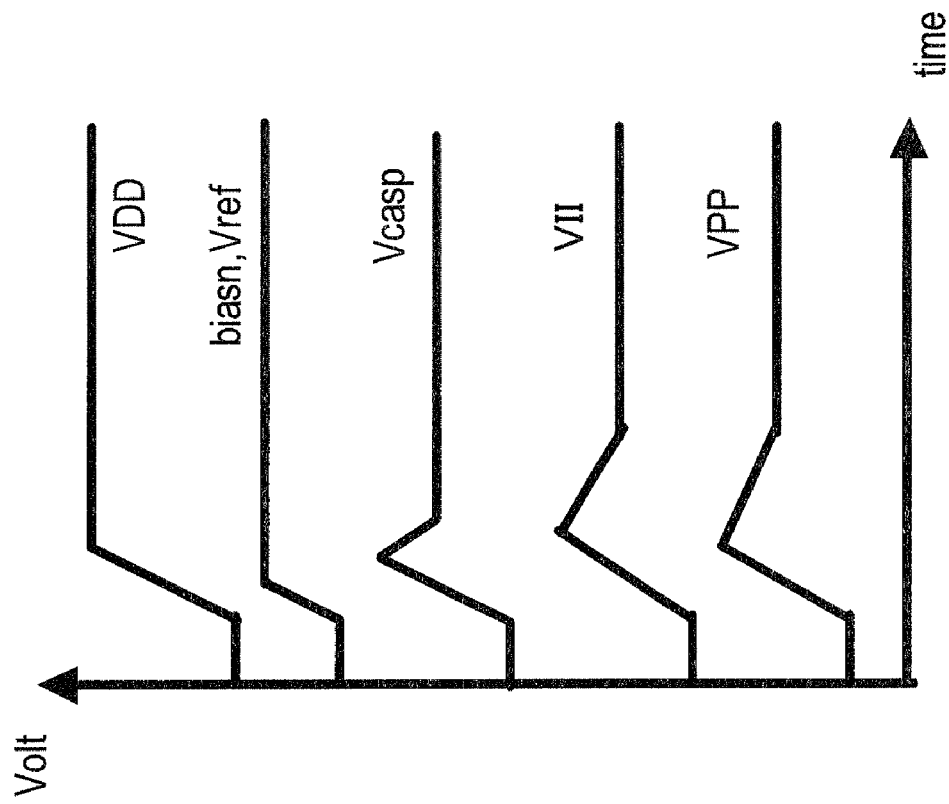
FIG. 11 is an operating waveform diagram showing erroneous operation at the time of power supply startup.

FIG. 11 is an operating waveform diagram showing erroneous operation at the time of power supply startup. After the external power supply VDD is turned on at the time of power supply startup and the external power supply voltage VDD rises, the activation signal actz goes to H level, and the internal step-down power supply generation circuit 12 and internal step-up power supply generation circuit 11 begin operation.

Also, the cascode bias potential Vcasp and bias potential biasn of the cascode bias generation circuit 13 and bias generation circuit 15 respectively both rise accompanying the rise in external power supply voltage VDD.

The cascode bias generation circuit 13 of FIG. 6 generates, in the normal operating state, a cascode bias potential Vcasp according to the ratio of the turn-on resistances of the transistors P20 and N21, and has a coupling capacitor C1 to ensure not being affected by the high-frequency fluctuation component of the power supply voltage VDD. Similarly, the cascode bias generation circuit 13 of FIG. 7 generates, in the normal operating state, a cascode bias potential Vcasp according to the ratio of the turn-on resistance of the transistor P22 and resistance R1 to the turn-on resistance of the transistor N23, has a coupling capacitor C2 to ensure not being affected by the high-frequency fluctuation component of the power supply voltage VDD.

In the normal state after the external power supply voltage VDD has risen, charging of the coupling capacitors C1 and C2 is completed, and the cascode bias potential Vcasp is maintained at an appropriate potential, so that the coupling capacitors C1, C2 operate appropriately to absorb high-frequency fluctuation components in the power supply voltage VDD. However, at the time of power supply startup, the cascode bias potential Vcasp follows the rise in external power supply voltage VDD by means of the coupling capacitors C1, C2, and reaches a higher potential than in the normal state. That is, the charging of the coupling capacitors C1, C2 lags behind the rapid rise of the external power supply voltage VDD, so that the cascode bias potential Vcasp is temporarily higher than the level determined by the resistance ratio in the normal operating state. When at least charging of the coupling capacitors C1, C2 by the transistors N21, N23 is completed, the cascode bias potential Vcasp first reaches the ideal level determined by the resistance ratio in the normal operating state. This is as shown in FIG. 11.

Due to this temporary overshooting of the cascode bias potential Vcasp, the second transistors P8, P9 of the differential amplifier circuit D-Amp shown in FIG. 4 enter the non-conducting state, the cascode current mirror circuit is turned off, and the output signal Vout goes to L level. In response to this L level of the output signal Vout, in the internal step-down power supply generation circuit 12, the output transistor P31 conducts, and the internal step-down power supply voltage VII overshoots the normal level. Also, in the internal step-up power supply generation circuit 11, the oscillation circuit 20 oscillates, and the internal step-up power supply voltage VPP overshoots the normal level. This overshooting of the internal power supply voltages VII, VPP may possibly destroy the transistor devices in the internal circuits to which the voltages are applied, detracting from device reliability.

FIG. 12 is a circuit diagram of the cascode bias generation circuit 13 in the first embodiment. In FIG. 12, the cascode bias generation circuit 13 and the differential amplifier circuit D-Amp of FIG. 4 are shown. This cascode bias generation circuit generates a cascode bias potential Vcasp for a P-channel transistor cascode current mirror circuit. This cascode bias generation circuit adopts the circuit of FIG. 6, but the circuit of FIG. 7 can also be used.

The cascode bias generation circuit 13 of FIG. 12 has, in addition to the transistors P20, N21 and capacitor C1 of the circuit of FIG. 6, N-channel transistors N41, N40 which conduct during power supply startup. A start signal sttz which is temporarily at H level during power supply startup is applied to the gate of transistor N41, and the bias potential biasn, which rises early during power supply startup, is supplied to transistor N40.

Figure 13:
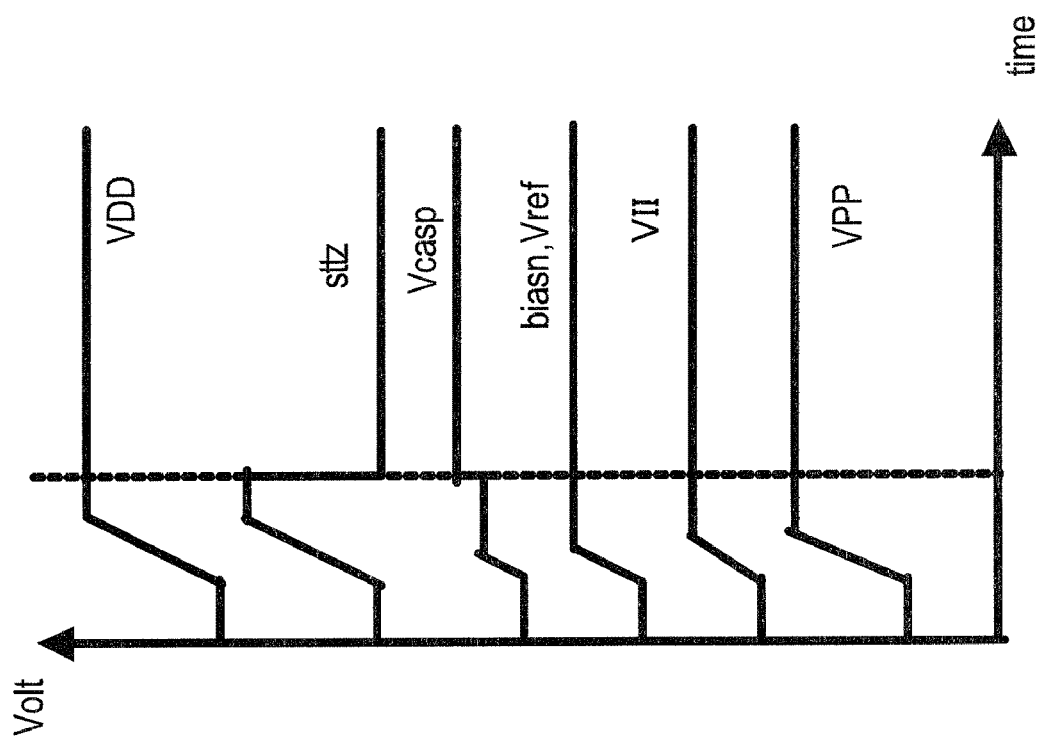
FIG. 13 is an operating waveform diagram at power supply startup in the first embodiment.

FIG. 13 is an operating waveform diagram at power supply startup in the first embodiment. The sequencer 14 (see FIG. 1) within the internal power supply circuit 10 outputs a start signal sttz which follows the rise of the external power supply voltage VDD during power supply startup to go to H level, and when startup of all internal power supplies has ended, gots to L level. The bias potential biasn also follows the rise of the external power supply voltage VDD to become H level. The start signal sttz is applied to the gate of transistor N41, and the bias potential biasn is applied to the gate of transistor N40, so that both transistors N40, N41 are conducting during power supply startup.

Consequently the cascode bias potential Vcasp is controlled according to the resistance ratio of the turn-on resistance of transistor P20 and the combined turn-on resistance of the transistors N41, N40, N21, and is held at a potential lower than the potential in the normal operating state. The coupling capacitor C1 is supplied with charging current from transistors N41, N40 in addition to transistor N21, so that overshooting of the cascode bias potential Vcasp to above the normal level is prevented.

By this means, erroneous operation does not occur in the cascode current mirror circuit to which the cascode bias potential Vcasp is supplied, nor does erroneous operation occur in the internal step-up power supply generation circuit 11 or internal step-down power supply generation circuit 12 using the former circuit, so that overshooting of the internal step-up power supply voltage VPP and internal step-down power supply voltage VII can be prevented or suppressed. When power supply startup ends, the start signal sttz goes to L level, so that the transistors N40, N41 become non-conducting, and the cascode bias generation circuit enters the normal operating state.

In order to appropriately prevent overshooting of the cascode bias potential Vcasp, it is desirable that the W/L of transistors N41, N40 be made larger than that of transistor N20.

Further, when this first embodiment is applied in the circuit of FIG. 7, in place of transistor P20 of FIG. 12, transistor P22 and resistance R1 of FIG. 7 are provided.

Figure 14:
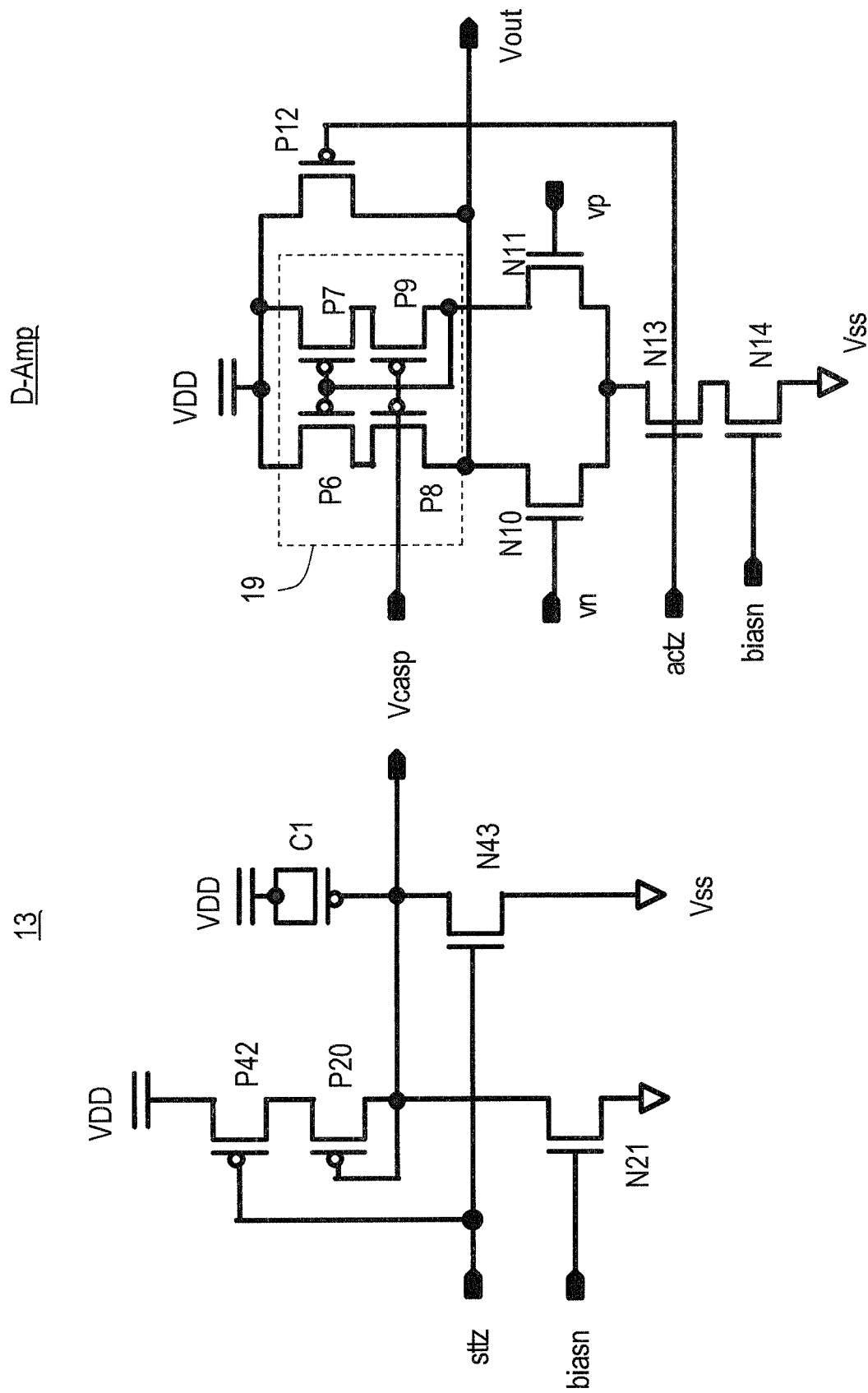
FIG. 14 is a circuit diagram of the cascode bias generation circuit 13 in a second embodiment.
Figure 15:
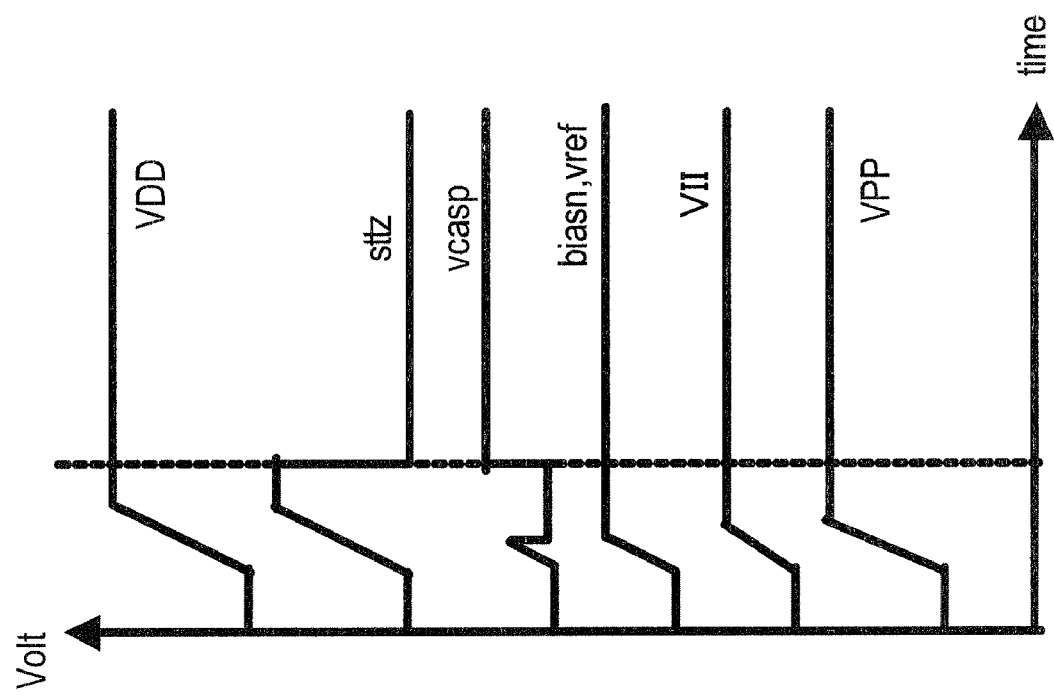
FIG. 15 is an operating waveform diagram at power supply startup in the second embodiment.

FIG. 14 is a circuit diagram of the cascode bias generation circuit 13 in a second embodiment. FIG. 15 is the operating waveform diagram during power supply startup in the second embodiment. FIG. 14 shows the cascode bias generation circuit 13 and the differential amplifier circuit D-Amp of FIG. 4. This cascode bias generation circuit generates a cascode bias potential Vcasp for a P-channel transistor cascode current mirror circuit 19. This cascode bias generation circuit adopts the circuit of FIG. 6, but the circuit of FIG. 7 can also be used.

The cascode bias generation circuit 13 has, in addition to the transistors P20, N21 and capacitor C1 of the circuit of FIG. 6, an N-channel transistor N43 which is conducting during power supply startup and a P-channel transistor P42 which is non-conducting during startup. A start signal sttz which is temporarily at H level during power supply startup is applied to the gates of transistors N43, P42.

As shown in FIG. 15, during power supply startup the start signal sttz is temporarily at H level, transistor N43 is conducting, and transistor P42 is non-conducting. As a result, during the interval in which the start signal sttz is at H level, the cascode bias potential Vcasp is at L level, that is, at ground level Vss. Hence overshooting of the cascode bias potential Vcasp to a high level is avoided, there is no erroneous operation of the cascode current mirror circuit, and overshooting of the internal step-down power supply voltage VII and internal step-up power supply voltage VDD is avoided. The size of transistor N43 should be such that there is sufficient current capacity to disable the action of the coupling capacitor C1 which follows the rise of the power supply voltage VDD.

Further, when this second embodiment is applied to the circuit of FIG. 7, in place of transistor P20 in FIG. 12, the transistor P22 and resistance R1 of FIG. 7 are provided.

Figure 16:
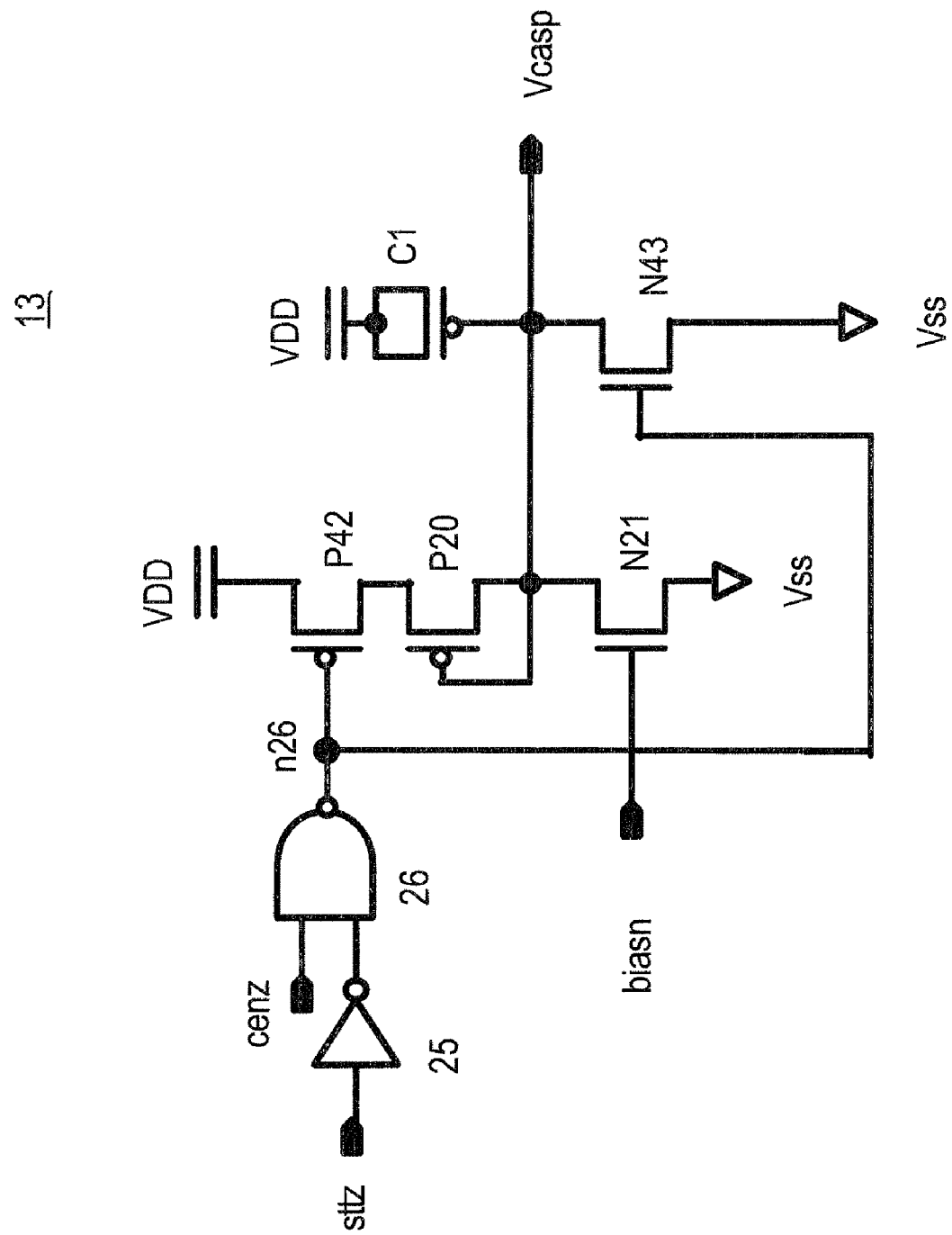
FIG. 16 is a circuit diagram of the cascode bias generation circuit 13 in a third embodiment.

FIG. 16 is a circuit diagram of the cascode bias generation circuit 13 in a third embodiment. This cascode bias generation circuit likewise generates a cascode bias potential Vcasp for a P-channel transistor cascode current mirror circuit. This cascode bias generation circuit adopts the circuit of FIG. 6, but the circuit of FIG. 7 can also be used.

Similarly to the example of FIG. 14, this cascode bias generation circuit 13 has, in addition to transistors P20, N21 and capacitor C1 of the circuit of FIG. 6, an N-channel transistor N43 which is conducting during power supply startup and a P-channel P42 which is non-conducting during startup. When the start signal sttz temporarily goes to H level during power supply startup, the output of inverter 25 goes to L level, the output n26 of NAND gate 26 goes to H level, transistor P42 is non-conducting, and transistor N43 is conducting. Consequently the cascode bias potential Vcasp is forced to L level.

Further, in the normal operating state (sttz=L), an enable signal cenz is in the enable state (H level), transistor P42 is conducting, and transistor N43 is non-conducting, and the cascode bias generation circuit 13 is in the active state. On the other hand, when the enable signal cenz goes to L level, the output n26 of NAND gate 26 goes to H level, transistor N43 is conducting, transistor P42 is non-conducting, and the circuit is in the inactive state. In the inactive state, the cascode bias potential Vcasp is at L level, and there is no current consumption.

The operating waveform diagram during power supply startup when using the cascode bias generation circuit of this third embodiment is the same as in FIG. 15. In place of the transistor P20, the transistor P22 and resistance R1 of FIG. 7 may be provided.

In the above explanation, cascode current mirror circuits using P-channel transistors and cascode bias generation circuits for the former were explained. However, these embodiments can also be applied to cascode current mirror circuits using N-channel transistors and to cascode bias generation circuits for such circuits.

Figure 17:
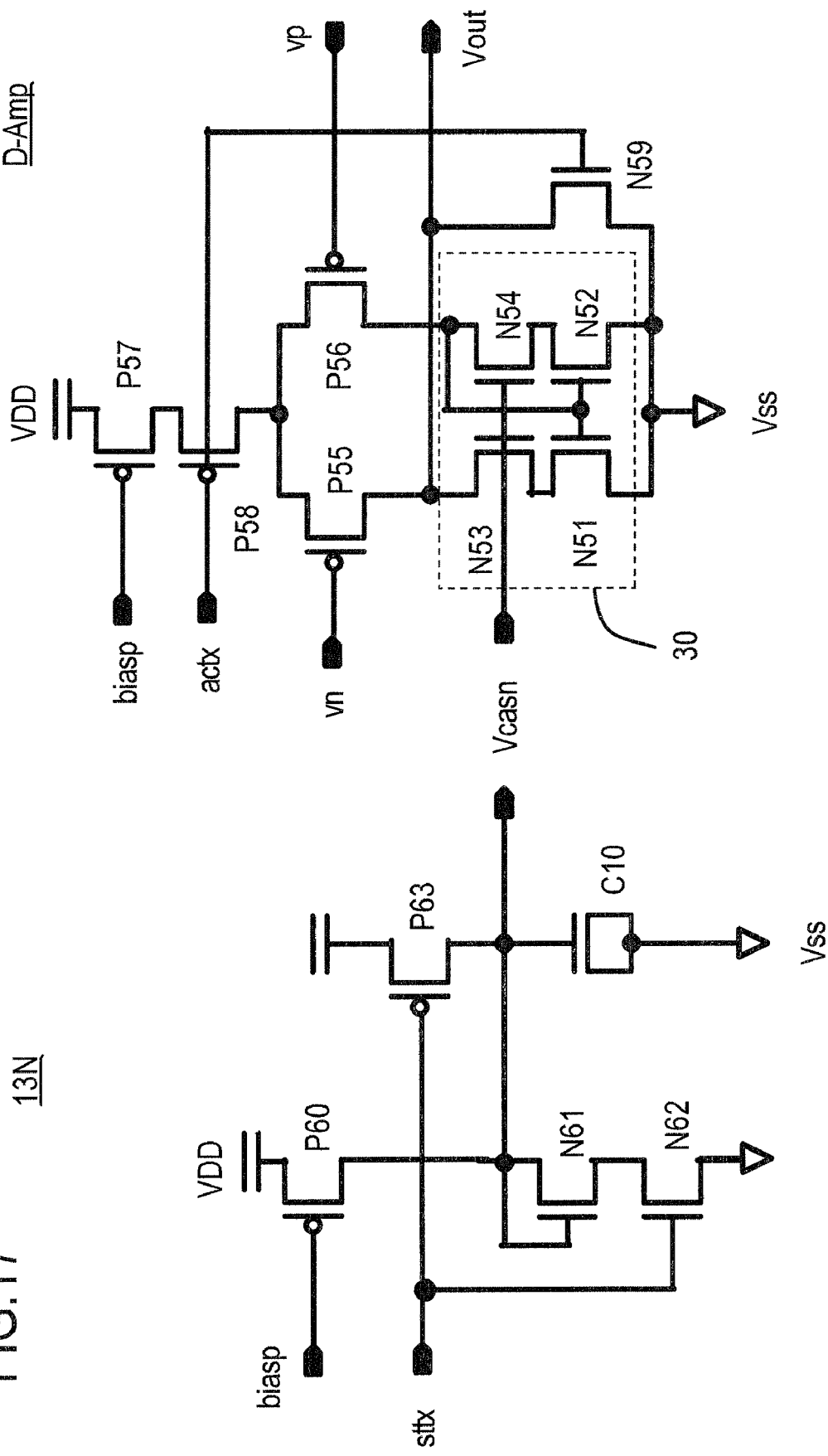
FIG. 17 is a circuit diagram showing an example of a cascode current mirror circuit using N-channel transistors in a present embodiment, and a cascode bias generation circuit for same.

FIG. 17 is a circuit diagram showing an example of a cascode current mirror circuit using N-channel transistors and a cascode bias generation circuit for the former in a present embodiment. The differential amplifier circuit is equivalent to that of FIG. 4 but with P-channel and N-channel devices exchanged; the cascode current mirror circuit is equivalent to that of FIG. 14 with P-channel and N-channel devices exchanged.

The differential amplifier circuit D-Amp shown in FIG. 17 has a cascode current mirror circuit 30 employing N-channel transistors. A pair of first transistors N51, N52 are connected in parallel to ground Vss, which is a power supply, and a common node is connected to the gates of these transistors. Further, second transistors N53, N54 are cascode-connected to these first transistors N51, N52, and an N-channel cascode bias potential Vcasn is supplied to the gates of these transistors. The source terminals of transistors P55, P56 are connected in common, and the pair of inputs vn, vp are supplied to the gates. Transistor P57 is a current switch, to the gate of which the bias potential biasp is supplied, and the activation signal actx is supplied to the gates of transistors P58, N59, so that when actx=L level transistor P58 is on and transistor N59 is off, and the differential amplifier circuit is in the activated state.

In operation of the differential amplifier circuit, when the inputs are vn>vp, transistor P56 is more conducting, and the output Vout is at L level; conversely, when vn<vp transistor P55 is more conducting, and the output Vout is at H level.

In the normal state in the cascode bias generation circuit 13N, the start signal sttx=H level, transistor P63 is off, transistor N62 is on, the turn-on resistance of transistor N61 is comparatively high, and the cascode bias potential Vcasn is maintained such that Vcasn>Vss+Vthn+Vov (where Vthn is the N-channel transistor threshold voltage, and Vov is the minimum drain-source voltage at which an N-channel transistors N51, N52 can operate in the saturation region). As a result, in the current mirror circuit 30, the source terminals of transistors N53, N54 are maintained at Vcasn−Vthn, and transistors N51, N52 operate in the saturation region. Further, due to the coupling capacitor C10, the above cascode bias potential is maintained even when there is fluctuation of the ground potential Vss.

When in the cascode bias generation circuit 13N the start signal sttx temporarily goes to L level at power supply startup, transistor P63 becomes conducting and transistor N62 becomes non-conducting, and the cascode bias potential Vcasn is forced to VDD. As a result, erroneous operation of the current mirror circuit 30 is avoided.

If these transistors P63, N62 are not provided, then it is anticipated that during power supply startup, although the external power supply voltage VDD rises, the coupling capacitor C10 is not charged rapidly, so that the rise of the cascode bias potential Vcasn is slow. Consequently the cascode bias potential Vcasn does not satisfy the above condition Vcasn>Vss+Vthn+Vov, and erroneous operation of the current mirror circuit may result.

The differential amplifier circuit of FIG. 17 can be applied to the internal step-down power supply generation circuits and internal step-up power supply circuits of FIG. 9 and FIG. 10. However, the logic of the output Vout of the differential amplifier circuit is inverted, so that an output-stage inverter must be added. In this case, if during power supply startup there is erroneous operation with the current mirror circuit in the off state, the output Vout of the differential amplifier circuit goes to H level, and similar to the explanation above, the internal step-down power supply voltage VII and the internal step-up power supply voltage VPP become high, and overshooting occurs.

An internal step-down power supply generation circuit may generate the intermediate potential between VDD and ground Vss from Vss as an internal step-down power supply voltage. Also, an internal step-up power supply generation circuit may generate a negative potential from ground Vss as an internal step-up power supply voltage. In this case, strictly speaking, the circuit is not a step-up circuit, but a step-down circuit.

An N-channel cascode bias generation circuit may be the circuit of FIG. 12, with P-channel and N-channel devices exchanged. In an N-channel cascode bias generation circuit, the start signal sttx has phase opposite the start signal sttz of a P-channel cascode bias generation circuit.

As explained above, by means of this embodiment, during power supply startup the cascode bias generation circuit generates a cascode bias potential which is lower than (in the case of a P-channel circuit) or higher than (in the case of an N-channel circuit) the cascode bias potential in the normal state, so that erroneous operation of the current mirror circuit can be avoided.

What is claimed is:

1. A current mirror circuit which is connected to first and second power supplies and generates a desired current, comprising:
- a plurality of first transistors which are connected in parallel to the first power supply side and the gates of which are connected to a common node;
- a plurality of second transistors which are cascode-connected to the plurality of first transistors and the gates of which are supplied with a cascode bias potential; and
- a cascode bias generation circuit which generates the cascode bias potential,
- wherein the cascode bias generation circuit maintains the cascode bias potential during normal operation at a first potential between the potentials of the first and second power supplies, and maintains the cascode bias potential during power-on at a second potential closer to the potential of the second power supply than the first potential.

2. The current mirror circuit according to claim 1, wherein the second power supply voltage is lower than the first power supply voltage, the first and second transistors are P-channel MOS transistors, and the second potential is at a lower level than the first potential.

3. The current mirror circuit according to claim 2, wherein the cascode bias generation circuit has a coupling capacitor between the first power supply and an output terminal of the cascode bias potential and has a power supply startup transistor which is provided between the second power supply and the output terminal and which is conducting during the power supply startup, and the cascode bias potential is controlled at the second potential by conduction of the power supply startup transistor during the power supply startup.

4. The current mirror circuit according to claim 2, wherein the cascode bias generation circuit has a coupling capacitor between the first power supply and an output terminal of the cascode bias potential, and further has a first power supply startup transistor which is provided between the first power supply and the output terminal and which is non-conducting during the power supply startup, and a second power supply startup transistor which is provided between the second power supply and the output terminal and which is conducting during the power supply startup, and the second potential is controlled at a second power supply level by the non-conduction of the first power supply startup transistor and by the conduction of the second power supply startup transistor during the power supply startup.

5. The current mirror circuit according to claim 1, wherein the second power supply voltage is higher than the first power supply voltage, the first and second transistors are N-channel MOS transistors, and the second potential is at a higher level than the first potential.

6. The current mirror circuit according to claim 5, wherein the cascode bias generation circuit has a coupling capacitor between the first power supply and an output terminal of the cascode bias potential and has a power supply startup transistor which is provided between the second power supply and the output terminal and which is conducting during the power supply startup, and the cascode bias potential is controlled at the second potential by conduction of the power supply startup transistor during the power supply startup.

7. The current mirror circuit according to claim 5, wherein the cascode bias generation circuit has a coupling capacitor between the first power supply and an output terminal of the cascode bias potential, and further has a first power supply startup transistor which is provided between the first power supply and the output terminal and which is non-conducting during the power supply startup, and a second power supply startup transistor which is provided between the second power supply and the output terminal and which is conducting during the power supply startup, and the second potential is controlled at a second power supply level by the non-conduction of the first power supply startup transistor and by the conduction of the second power supply startup transistor during the power supply startup.

8. An internal power supply generation circuit, which generates an internal power supply from a first or a second power supply, comprising:
- a differential amplifier circuit, having as a load circuit the current mirror circuit according to any one of claim 1 through claim 7; and
- an output circuit, which generates the internal power supply according to an output signal of the differential amplifier circuit,
- wherein the differential amplifier circuit generates the output signal according to a potential difference between a potential of the internal power supply generated by the output circuit and a desired reference potential.

9. The internal power supply generation circuit according to claim 8, wherein the internal power supply potential is controlled at a potential between the potentials of the first and second power supplies, and the output circuit has an output transistor which is conducting according to the output signal of the differential amplifying circuit and which supplies a power supply current from the first or second power supply to the internal power supply.

10. The internal power supply generation circuit according to claim 8, wherein the internal power supply potential is controlled at a potential outside the potentials of the first and second power supplies, and the output circuit has an oscillation circuit which operates according to an output signal of the differential amplifying circuit and a pump circuit which supplies, with pumping, a power supply current from the first or second power supply to the internal power supply by means of oscillation pulses of the oscillation circuit.

11. An integrated circuit device, comprising:
- the internal power supply generation circuit according to claim 8; and
- an internal circuit to which the internal power supply is supplied.

* * * * *

UNITED STATES PATENT AND TRADEMARK OFFICE
CERTIFICATE OF CORRECTION

PATENT NO. : 7,859,135 B2
APPLICATION NO. : 12/147098
DATED : December 28, 2010
INVENTOR(S) : Atsushi Takeuchi et al.

It is certified that error appears in the above-identified patent and that said Letters Patent is hereby corrected as shown below:

Title Page:

In (75) Please correct the Inventor Information As Follows:

(75) Inventors: Atsushi TAKEUCHI, Kawasaki (JP);

Atsumasa SAKO, Kawasaki (JP)

Signed and Sealed this
Seventeenth Day of May, 2011

David J. Kappos
*Director of the United States Patent and Trademark Office*